United States Patent [19]

Giebel et al.

[11] Patent Number: 4,459,608
[45] Date of Patent: Jul. 10, 1984

[54] REPROGRAMMABLE SEMICONDUCTOR READ-ONLY MEMORY OF THE FLOATING-GATE TYPE

[75] Inventors: Burkhard Giebel, Munich; Adolf Scheibe, Ottobrunn, both of Fed. Rep. of Germany

[73] Assignee: Siemens Aktiengesellschaft, Berlin and Munich, Fed. Rep. of Germany

[21] Appl. No.: 364,886

[22] Filed: Apr. 2, 1982

Related U.S. Application Data

[63] Continuation of Ser. No. 128,175, Mar. 7, 1980, abandoned.

[30] Foreign Application Priority Data

Mar. 7, 1979 [DE] Fed. Rep. of Germany ....... 2908796

[51] Int. Cl.$^3$ ............................................ H01L 29/78
[52] U.S. Cl. .............................. 357/23.5; 357/23.14; 357/23.1
[58] Field of Search ................ 357/23.5, 23.14, 23 R, 357/41

[56] References Cited

U.S. PATENT DOCUMENTS 4,274,012  6/1981  Simko ................................ 357/23.5
4,361,847  11/1982  Harari ............................... 357/23.5

Primary Examiner—Martin H. Edlow
Attorney, Agent, or Firm—Herbert L. Lerner; Laurence A. Greenberg

[57] ABSTRACT

Reprogrammable semiconductor read-only memory with memory cells of the floating-gate type, including an additional potential carrier for each memory cell for capacitively coupling a further potential to the floating gate.

3 Claims, 5 Drawing Figures

REPROGRAMMABLE SEMICONDUCTOR READ-ONLY MEMORY OF THE FLOATING-GATE TYPE

This is a continuation of application Ser. No. 128,175, filed Mar. 7, 1980 now abandoned.

The invention relates to a reprogrammable semiconductor read-only memory with memory cells of the floating-gate type such as are described, for instance, in the paper published under the title "Electrically Erasable and Reprogrammable Read-only Memory using the n-Channel SIMOS One-Transistor Cell" in "IEEE Trans. on Electron Devices" Vol. ED-24, No. 5, May 1977, pages 606–610.

According to the paper which also appeared in this publication, pages 600 et seq., "Technology of a n-Channel One-Transistor EAROM Cell Called SIMOS", the cut-off voltage excursion $\Delta U_T$, i.e. the cut-off voltage shift reached in the programming of these memory cells is, according to the relationship:

$$\Delta U_T = U_P - U_{DS}' \cdot \frac{C_{FS} + C_{FD} + C_{FSub} + C_{FC}}{C_{FC}} \quad (1)$$

essentially a function of the coupling capacities which are contained in the $Si^2$-Gate structure, where:

$U_P$ = Programming voltage at the control gate;
$U'_{DS}$ = the potential, referred to the source, of the channel section from which the charge carriers are injected into the floating gate;
$C_{FS}$ = Coupling capacity between the floating gate and the source;
$C_{FD}$ = Coupling capacity between the floating gate and the drain;
$C_{FC}$ = Coupling capacity between the control gate and the floating gate; and
$C_{FSub}$ = Coupling capacity between the floating gate and the substrate;

A large cut-off voltage excursion $\Delta U_T$ therefore also requires a large coupling capacity $C_{FC}$ and therewith, for instance, a large overlap area between the "floating" gate, as it will be referred to hereinbelow, and the control gate. Therefore, narrow limits are set for a reduction of the area required for each memory cell and therefore, for an increase of the storage density.

It is accordingly an object of the invention to provide a reprogrammable semiconductor read-only memory of the floating-gate type which overcomes the hereinafore-mentioned disadvantages of the heretofore-known devices of this general type and with storage cells of the floating gate type, in which:

1. the coupling capacity $C_{FC}$ between the floating gate and the control gate or the overlap area between these two gates is reduced for the same cut-off voltage excursion $\Delta U_T$; or
2. the cut-off voltage excusion $\Delta U_T$ is increased, with the overlap area between the two gates being the same; or
3. the programming voltage $U_P$, i.e. the control gate voltage required for writing the information into the storage cells is reduced, with the same cut-off voltage excursion $\Delta U_T$ and the same overlap area between the two gates.

With the foregoing and other objects in view there is provided, in accordance with the invention, a reprogrammable semiconductor read-only memory with memory cells of the floating-gate type, comprising an additional potential carrier for each memory cell for capacitively coupling a further potential to the floating gate.

In accordance with another feature of the invention, each memory cell includes an additional potential carrier in the form of a separate diffusion zone capacitively coupled to the floating gate.

In accordance with a further feature of the invention, each memory cell includes an additional potential carrier in the form of an Si-electrode capacitively coupled to the floating gate.

In accordance with an added feature of the invention, there is provided an increased capacitive coupling of the drain diffusion zone to the floating gate.

In accordance with a concomitant feature of the invention, the gate oxide thickness is reduced in the floating gate underdiffusion area.

Other features which are considered as characteristic for the invention are set forth in the appended claims.

Although the invention is illustrated and described herein as embodied in a reprogrammable semiconductor read-only memory of the floating-gate type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
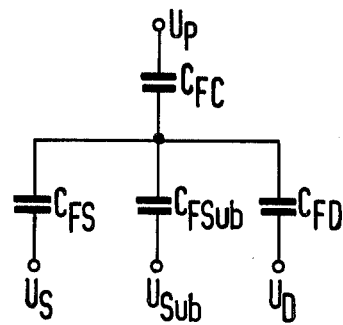
FIG. 1 is a schematic circuit diagram of a conventional prior art memory.

Referring now to the figures of the drawing and first particularly to FIG. 1 thereof, there is seen a circuit diagram of a conventional memory with an $Si^2$-Gate structure that is the equivalent of the following relationship of the cut-off voltage excursion or shift $\Delta U_T$ that is reached in the programming of the memory cell:

$$\Delta U_T = U_P - U_{DS}' \cdot \frac{C_{FS} + C_{FD} + C_{FSub} + C_{FC}}{C_{FC}}$$

In the equivalent circuit shown in FIG. 1 for the coupling capacities: $U_p$ is the programming voltage at the control gate; $U'_{DS}$ is the potential of the channel section from which the charge carriers are injected into the floating gate referred to the source; $C_{FS}$ is the coupling capacity between the floating tate and the source; $C_{FD}$ is the coupling capacity between the floating gate and the drain; $C_{FC}$ is the coupling capacity between the control gate and the floating gate; and $C_{FSub}$ is the coupling capacity between the floating gate and the substrate. In this structure a large coupling capacity $C_{FC}$ is needed if there is a large cut-off voltage excursion $\Delta U_T$. This also requires a large overlap area between the so-called "floating gate", as it will be referred to hereinbelow, and the control gate. Because of these restrictions, narrow limits are imposed for reducing the area needed for each memory cell and accordingly to increase the storage density.

Figure 2:
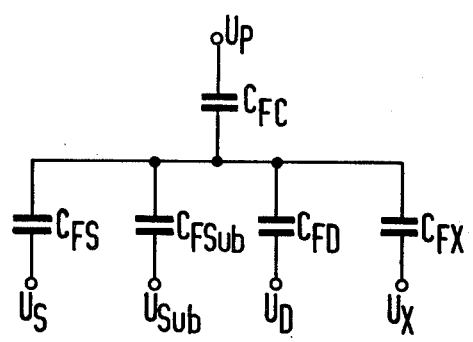
FIG. 2 is a schematic circuit diagram of a memory in accordance with the invention.

In order to overcome these disadvantages, the circuit diagram of FIG. 2 representing the invention shows a reprogrammable semiconductor read-only memory with memory cells of the floating-gate type, having an additional potential carrier per storage cell, by way of which a further potential $U_X$ can be coupled capacitively to the floating gate.

Since here $$\Delta U_T = U_P - U_{DS}' \cdot \frac{C_{FS} + C_{FD} + C_{FSub} + C_{FX}}{C_{FC}} + U_X \frac{C_{FX}}{C_{FC}}, \quad (2)$$

the additional potential carrier causes an increase of the cut-off voltage excursion $\Delta U_T$ by the amount $$(U_X - U_{DS}') \cdot \frac{C_{FX}}{C_{FC}}, \quad (3)$$

where $C_{FX}$ is the coupling capacity between the floating gate and the additional potential carrier.

If the cut-off voltage excursion $\Delta U_T$ is not increased, either the programming voltage $U_P$ can be reduced according to relation (2) or the area of the memory cells can be reduced through the coupling capacity $C_{FC}$, which makes it possible to provide read-only memories with higher storage density.

Figure 4:
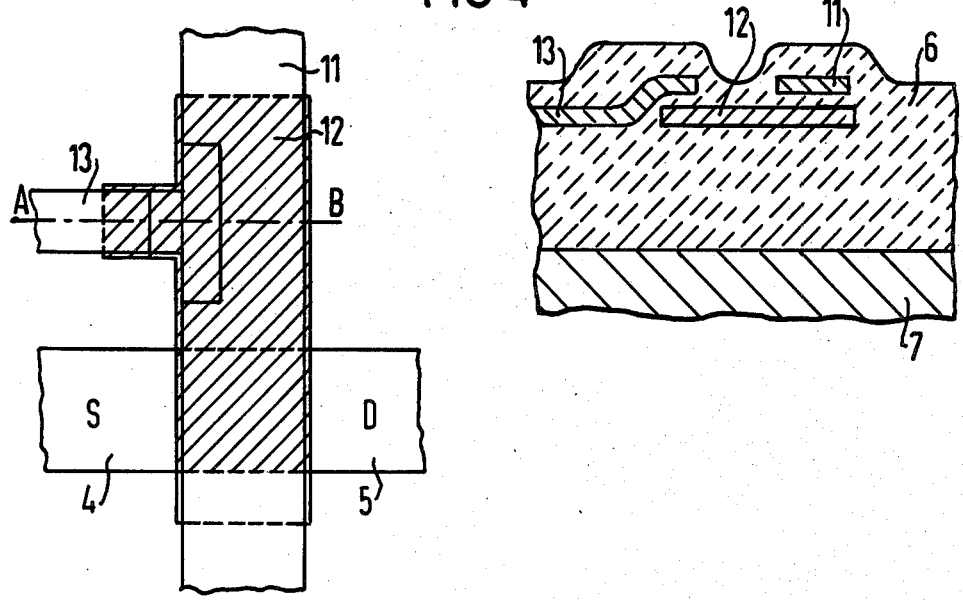
Figure 5:
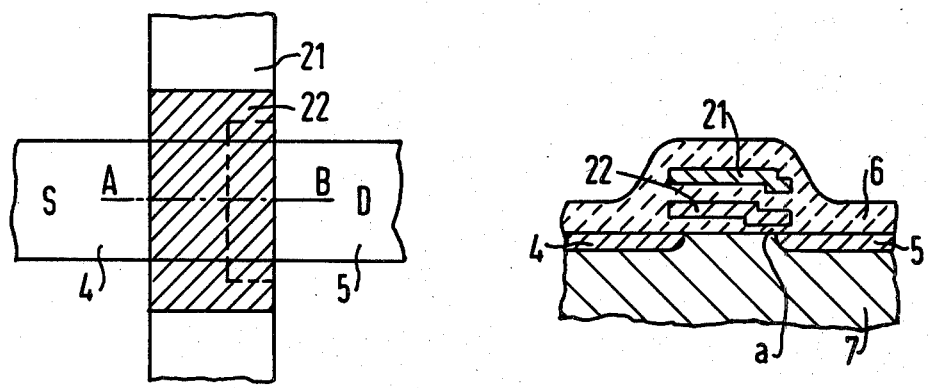

Suitable examples for creating additional potential carriers according to the invention will be explained hereinbelow, making reference to FIGS. 3-5. Like parts in the figures are provided with the same reference symbols. The left-hand side of each figure represents the top view and its respective right-hand side represents a cross-sectional view taken along the line A-B through the memory cell of the floating-gate type illustrated in a fractional view.

Figure 3:
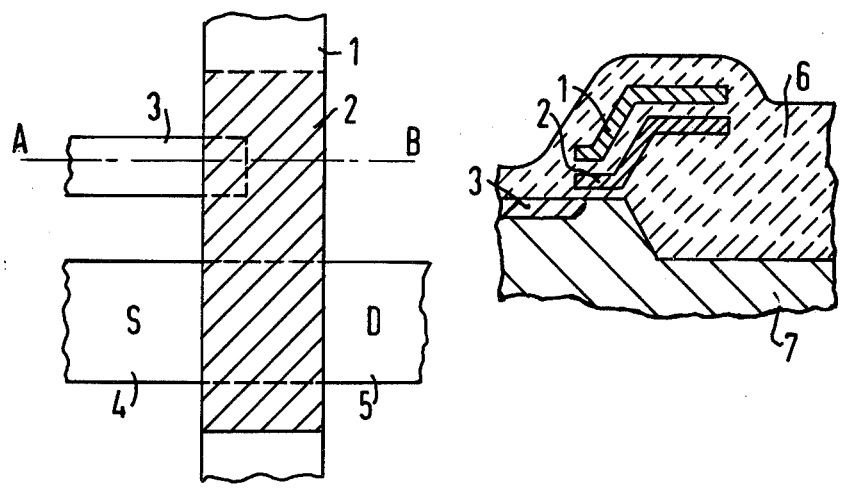
FIGS. 3–5 are each diagrammatic fragmentary views of different embodiments of memory cells in accordance with the invention, the left hand side of each figure being a top plan view and the right hand side of each figure being a cross-sectional view taken along the line A—B thereof.

1. Embodiment Example According to FIG. 3:

The memory cell shown in FIG. 3 has a semiconductor substrate 7 which is provided in the usual manner with a source 4 and a drain 5 and carries an insulating layer applied to the substrate. In particular, the insulating layer is an SiO$_2$-layer 6 with a control gate 1 and a floating gate 2 disposed therein. An additional diffusion zone 3 which serves as the potential carrier is offset relative to the source 4 and is capacitively coupled to the floating gate 2; this increases the cut-off voltage excursion $\Delta U_T$ by the amount $$(U_X - U_{DS}') \frac{C_{FX}}{C_{FC}} \quad (4)$$

when voltage is applied. The large coupling capacity between the floating gate and the additional diffusion zone 3 is achieved by a reduction of the oxide thickness between the diffusion zone 3 and the gate 2.

This memory cell is suitable, for instance, as an electrically erasable SIMOS-memory cell (EEPROM or EAROM application) with a separate erase diffusion zone.

2. Embodiment Example According to FIG. 4:

This figure likewise shows a memory cell with a control gate 11 and a floating gate 12. To increase the cut-off voltage excursion $\Delta U_T$, an Si-Electrode 13 is additionally coupled capacitively to the floating gate 12. The cut-off voltage excursion is then increased by the amount already mentioned in Example 1.

3. Embodiment Example According to FIG. 5:

The control gate and floating gate of this memory cell, shown schematically and in a fractional view, are designated with reference numerals 21 and 22, respectively. The increased capacitive coupling of the drain diffusion zone 5 to the floating gate 22 is obtained by a reduction of the gate oxide thickness a in the area between the floating gate 22 and the "Underdiffusion" of the drain 5. The "additional potential" created in this manner is $U_X = U_{DS}$, where $U_{DS} > U'_{DS}$. Due to this increased capacitive coupling, the cut-off voltage excursion $\Delta U_T$ is therefore increased by the amount $$(U_{DS} - U_{DS}') \frac{C_{FX}}{C_{FC}}, \quad (5)$$

where $U_{DS}$ is the voltage present between the source and the drain.

This kind of increased capacitive coupling can generally be provided in memory cells of the floating-gate type.

There are claimed:

1. Reprogrammable semiconductor read-only memory with memory cells of the floating-gate type, comprising a semiconductor substrate having a source region and a drain region for programming the memory cells by current flow therebeteween, an insulating layer disposed on said substrate, a floating gate and a control gate disposed in said insulating layer, the memory cells being programmed by means of channel injection, and having an operating voltage excursion being dependent on the potential of the programming voltage and on the potential:

$$U'_{DS} \cdot \frac{C_{FS} + C_{FD} + C_{FSub} + C_{FC}}{C_{FC}}$$

wherein:
 $U'_{DS}$ is the potential of the channel section relative to said source from which the charge carriers are injected into said floating gate,
 $C_{FS}$ is the coupling capacity between said floating gate and said source,
 $C_{FD}$ is the coupling capacity between said floating gate and said drain,
 $C_{FC}$ is the coupling capacity between said control gate and said floating gate, and
 $C_{FSub}$ is the coupling capacity between said floating gate and said substrate,
and an additional potential carrier for capacitively coupling a further potential to the floating gate during programming.

2. Read-only memory according to claim 1, wherein each memory cell includes an additional potential carrier in the form of a separate diffusion zone capacitively coupled to the floating gate.

3. Read-only memory according to claim 1, wherein each memory cell includes an additional potential carrier in the form of a silicon electrode capacitively coupled to the floating gate.

* * * * *